US009764543B2

(12) United States Patent
Uchida et al.

(10) Patent No.: US 9,764,543 B2
(45) Date of Patent: Sep. 19, 2017

(54) PASTE SUPPLY APPARATUS AND SCREEN PRINTING MACHINE

(71) Applicant: PANASONIC INTELLECTUAL PROPERTY MANAGEMENT CO., LTD., Osaka (JP)

(72) Inventors: Hideki Uchida, Yamanashi (JP); Masaaki Tokunaga, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 67 days.

(21) Appl. No.: 14/638,566

(22) Filed: Mar. 4, 2015

(65) Prior Publication Data

US 2015/0258773 A1    Sep. 17, 2015

(30) Foreign Application Priority Data

Mar. 17, 2014    (JP) ................................. 2014-053060

(51) Int. Cl.
*B41F 15/40*    (2006.01)
*B41F 15/42*    (2006.01)
(Continued)

(52) U.S. Cl.
CPC ................ *B41F 15/42* (2013.01); *B23K 3/06* (2013.01); *B41F 15/0813* (2013.01);
(Continued)

(58) Field of Classification Search
CPC .......... B41F 15/40; B41F 15/42; B41F 15/44; B41F 15/0813; B41F 31/02; B41F 15/0881; B23K 3/06; B41P 2215/50; H05K 3/3484
(Continued)

(56) References Cited

U.S. PATENT DOCUMENTS 2,111,207 A * 3/1938 Denelsbeck ........ B41F 15/0886
101/124
3,153,815 A * 10/1964 Seidl ................... B29C 45/0005
222/342
(Continued)

FOREIGN PATENT DOCUMENTS

| JP | 06-283856 | * | 7/1994 | ............... H05K 3/38 |
| JP | 08-207243 | * | 8/1996 | .............. B41F 15/40 |
| JP | 2010-172928 A | | 8/2010 | |

*Primary Examiner* — Jill Culler
*Assistant Examiner* — Marissa Ferguson Samreth
(74) *Attorney, Agent, or Firm* — Pearne & Gordon LLP

(57) ABSTRACT

A paste supply apparatus includes: a pot holder which holds a paste pot including an inner lid movable in a container; an ejecting member; an annular protruding portion protruding downward from a lower surface of the ejecting member; a suction power generating mechanism which generates suction power in an internal space surrounded by the annular protruding portion; and an ejecting member lifting unit which moves up and down the ejecting member, The ejecting member lifting unit causes the ejecting member to press down the inner lid of the paste pot held by the pot holder to eject the paste from the through hole, and thereafter lifts the ejecting member which holds the inner lid by the suction power generated within the internal space of the annular protruding portion by the suction power generating mechanism.

6 Claims, 7 Drawing Sheets

(51) Int. Cl.
  *B41F 15/08* (2006.01)
  *H05K 3/34* (2006.01)
  *B41F 31/02* (2006.01)
  *B41F 15/44* (2006.01)
  *B23K 3/06* (2006.01)

(52) U.S. Cl.
  CPC .......... *B41F 15/0881* (2013.01); *B41F 15/40* (2013.01); *B41F 15/44* (2013.01); *B41F 31/02* (2013.01); *H05K 3/3484* (2013.01); *B41P 2215/50* (2013.01)

(58) Field of Classification Search
  USPC .......................................... 101/123; 222/342
  See application file for complete search history.

(56) References Cited

U.S. PATENT DOCUMENTS

| | | | | |
|---|---|---|---|---|
| 3,327,906 | A * | 6/1967 | Gomann | A24C 5/24 |
| | | | | 222/389 |
| 4,808,435 | A * | 2/1989 | Cropp et al. | 427/97.8 |
| 6,216,589 | B1 * | 4/2001 | Tani | 101/123 |
| 2004/0244612 | A1 * | 12/2004 | Willshere | 101/123 |
| 2009/0294483 | A1 * | 12/2009 | Kim | 222/386 |

\* cited by examiner

PASTE SUPPLY APPARATUS AND SCREEN PRINTING MACHINE

BACKGROUND

1. Technical Field

One or more embodiments of the present invention relate to a paste supply apparatus which ejects and supply paste on a mask from a paste pot, and a screen printing machine including the paste supply apparatus.

2. Background Art

JP-A-2010-172928 describes a paste supply apparatus which supplies paste on a mask for a screen printing. The past supply apparatus ejects and supplies the past directly from a commercially-available paste pot which stores the paste in a tubular container. In the paste supply apparatus, the paste pot is held such that a through hole formed in a bottom portion of the container faces downward, and the paste is directly ejected by using an ejecting member. In the above-described type of the paste supply apparatus which directly ejects the paste by the ejecting member, attachment of the ejecting member so as to firmly contact an inner wall of the container requires time and effort. Therefore, there is another type of the paste supply apparatus which causes the ejecting member to press down an inner lid.

SUMMARY

However, in the type of the paste supply apparatus which supplies the paste directly from the paste pot, even when pressing down of the ejecting member is stopped to stop an outflow of the paste, drop of the paste from the through hole occurs, which may interrupt operation.

An object of one or more embodiments of the present invention is to provide a paste supply apparatus and a screen printing machine which can prevent drop of paste from a paste pot.

In one more embodiments of the present invention, there is provided a paste supply apparatus including: a pot holder which holds a paste pot including a tubular container which stores paste and which includes a bottom portion having a through hole and an inner lid movable in the container, such that the through hole of the paste pot faces downward; an ejecting member having a diameter smaller than an inner diameter of the container; an annular protruding portion provided to protrude downward from a lower surface of the ejecting member; a suction power generating mechanism which generates suction power in an internal space surrounded by the annular protruding portion; and an ejecting member lifting unit which moves up and down the ejecting member, and which causes the ejecting member to press down the inner lid of the paste pot held by the pot holder to eject the paste from the through hole, and thereafter lifts the ejecting member which holds the inner lid by the suction power generated within the internal space of the annular protruding portion by the suction power generating mechanism.

In one more embodiments of the present invention, there is provided a screen printing machine including: a mask; a paste supply apparatus which supplies paste on the mask by using a paste pot including a tubular container which stores the paste and which includes a bottom portion having a through hole and an inner lid movable in the container; a squeegee slidable on the mask on which the paste is supplied by the paste supply apparatus, wherein the paste supply apparatus includes: a pot holder which holds the past pot such that the though hole faces downward; an ejecting member having a diameter smaller than an inner diameter of the container; an annular protruding portion provided to protrude downward from a lower surface of the ejecting member; a suction power generating mechanism which generates suction power in an internal space surrounded by the annular protruding portion; and an ejecting member lifting unit which moves up and down the ejecting member, and which causes the ejecting member to press down the inner lid of the paste pot held by the pot holder to eject the paste from the through hole, and thereafter lifts the ejecting member which holds the inner lid by the suction power generated within the internal space of the annular protruding portion by the suction power generating mechanism.

According to one or more embodiments of the present invention, it is possible to provide a paste supply apparatus and a screen printing machine which can prevent drop of paste from a paste pot.

DETAILED DESCRIPTION

Figure 1:
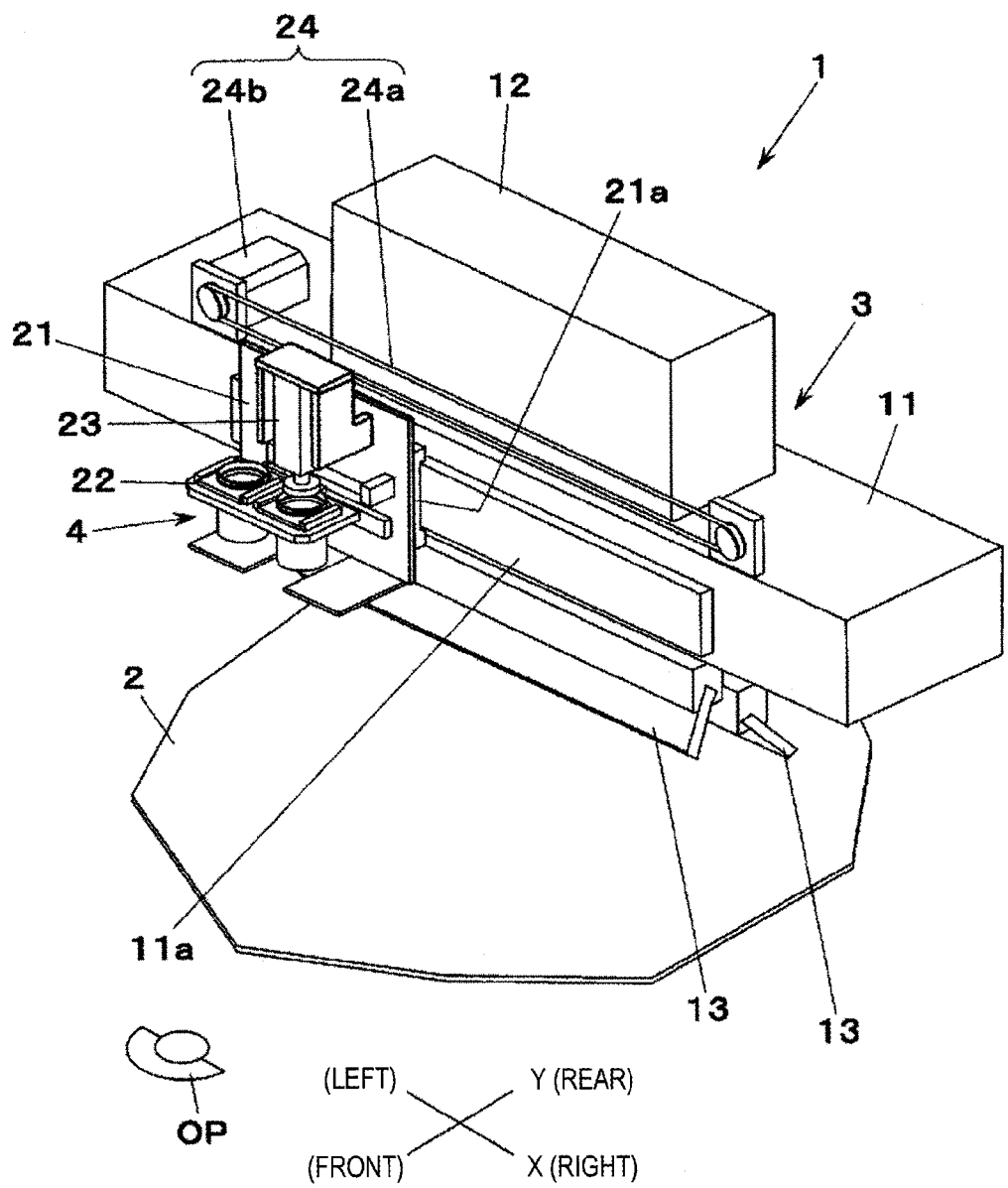
FIG. 1 is a perspective view of a screen printing machine according to an embodiment of the present invention.

One or more embodiments of the present invention will be described with reference to the drawings. FIG. 1 shows a screen printing machine 1 which is a machine for screen-printing paste such as solder paste on a board (not shown) and which includes a mask 2 having pattern holes corresponding to positions of electrodes of the board, a print head 3 provided above the mask 2, and a paste supply apparatus 4 provided in the print head 3.

As shown in FIG. 1, the print head 3 includes: a movable base 11 which is moved in a front-rear direction viewed from an operator OP (hereinafter also referred to as a Y-axis direction) by a head moving mechanism (not shown); a squeegee lifting mechanism 12 provided on an upper surface of the movable base 11; two squeegees 13 which are provided below the movable base 11 and individually moved up and down by the squeegee lifting mechanism 12. The squeegees 13 extend in a right-left direction viewed from the operator OP (hereinafter also referred to as an X-axis direction, and oppose each other in the Y-axis direction.

Figure 2:
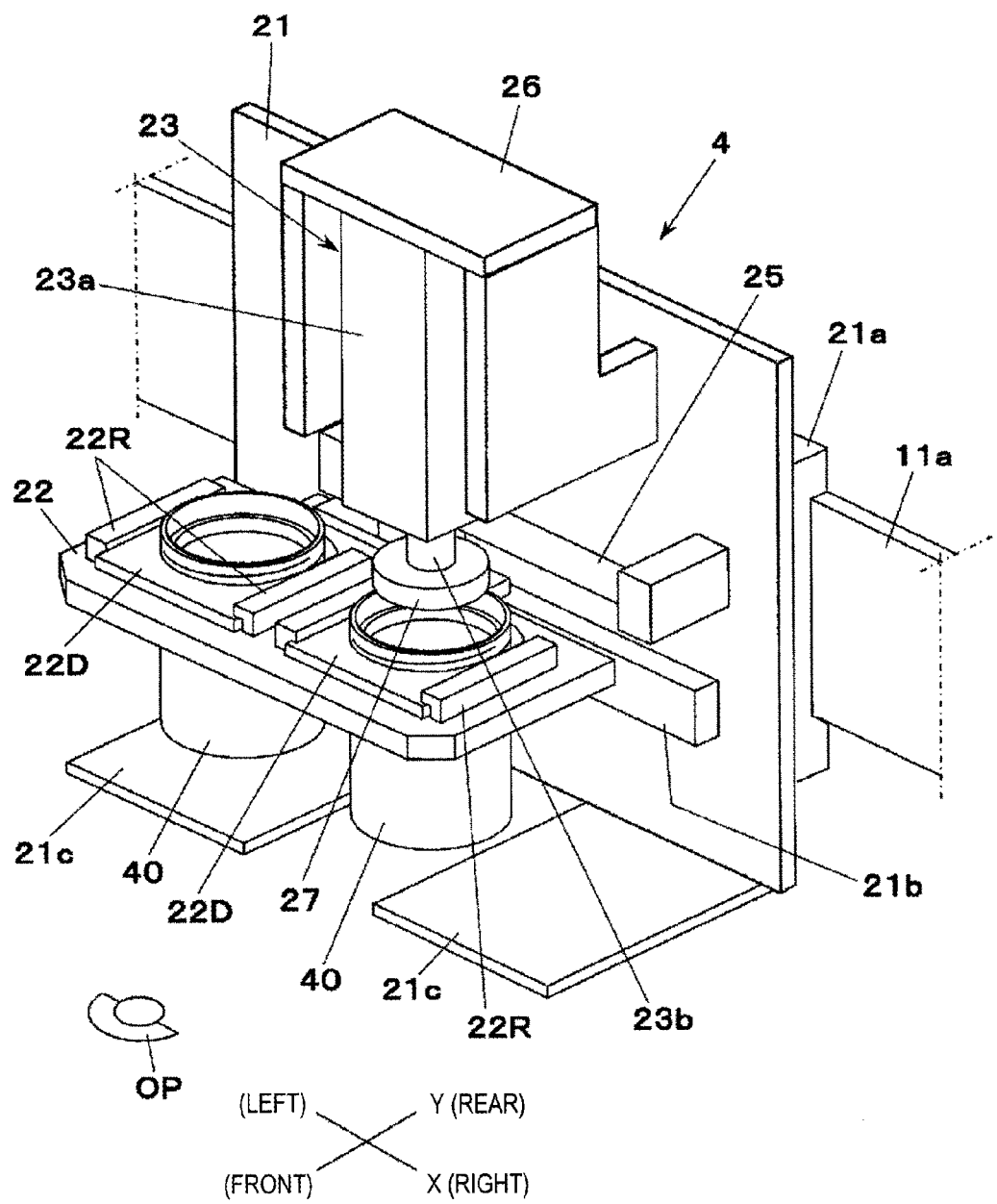
FIG. 2 is a perspective view of a paste supply apparatus provided in the screen printing machine according to the embodiment of the present invention.

As shown in FIGS. 1 and 2, the paste supply apparatus 4 includes: a base member 21; a pot holder 22 provided on a front surface (opposing the operator OP) of the base member 21; and a pressing cylinder 23 provided on the front surface of the base member 21. On a front surface of the movable base 11, a first guide 11a is provided to extend in the X-axis direction. A first slider 21a is provided on a rear surface side of the base member 21, and is slidably attached to the first guide 11a.

As shown in FIG. 1, a belt driving mechanism 24 is provided on the movable base 11, and includes a timing belt 24a spanned to extend in the X-axis direction; and a motor 24b which drives the timing belt 24a. The rear surface of the base member 21 is coupled to the timing belt 24a. When the motor 24b drives the timing belt 24a, the base member 21 (i.e., the paste supply apparatus 4) moves along the X-axis direction in front of the movable base 11.

Figure 3:
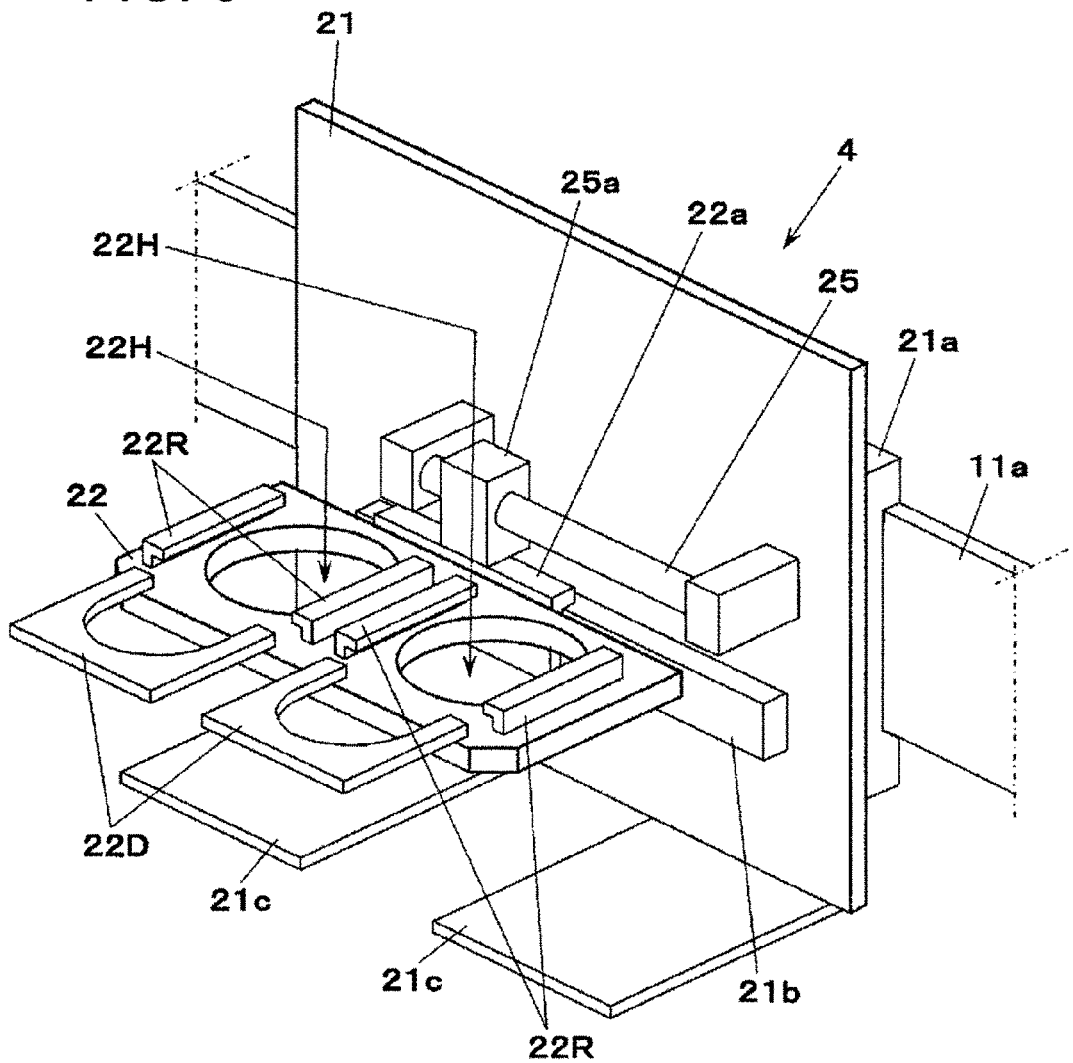
FIG. 3 is a perspective view of the paste supply apparatus according to the embodiment of the present invention.

As shown in FIG. 3, the pot holder 22 is formed of a plate member provided to extend in a horizontal direction, and includes two pot insertion holes 22H arranged in the X-axis direction. Each of the pot insertion holes 22H allows a paste pot 40 to be inserted therein (FIG. 2).

As shown in FIG. 3, on the front surface of the base member 21, a second guide 21b is provided to extend in the X-axis direction. A second slider 22a is provided on a rear surface side of the pot holder 22, and is slidably attached to the second guide 21b. On the base member 21 and above the second guide 21b, a rod-less cylinder 25 is provided to move a moving body 25a along the X-axis direction. The second slider 22a is coupled to the moving body 25a. When the rod-less cylinder 25 moves the moving body 25a along the X-axis direction, the pot holder 22 moves along the X-axis direction in front of the base member 21.

As shown in FIG. 2, on an upper region of the front surface of the base member 21, a bracket 26 is provided. A cylinder tube 23a of the pressing cylinder 23 is attached to the bracket 26. The pressing cylinder 23 is provided such that a piston rod 23b faces downward, and an ejecting member 27a is attached to a lower end of the piston rod 23b. The ejecting member has a disk shape (or cylindrical shape) of a diameter smaller than an inner diameter of a container 41 of the the paste pot 40.

Figure 4:
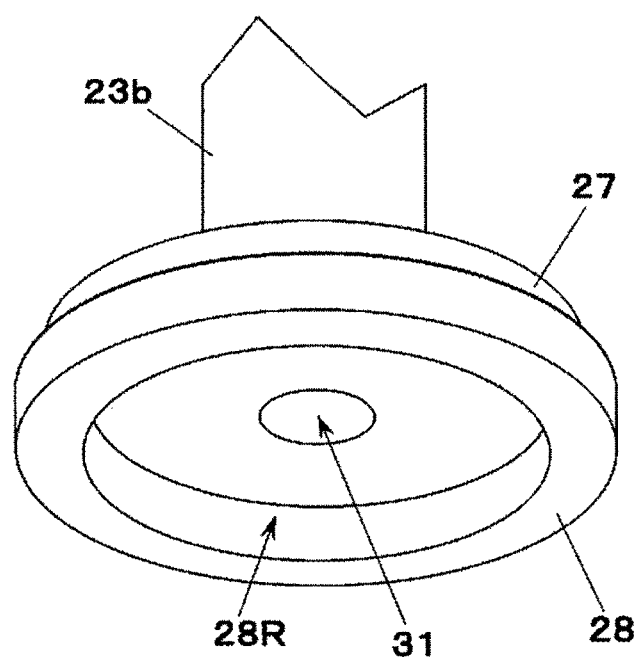
FIG. 4 is a lower perspective view of an ejecting member provided in the paste supply apparatus according to the embodiment of the present invention.

On the lower surface of the ejecting member 27, an annular member 28 is provided (FIG. 4). The annular member 28 serves as an example of an annular protruding portion provided to protrude downward from the lower surface of the ejecting member. As used herein, the term "annular" means a shape which surrounds something, and may include a circular ring shape or a hollow polygonal shape. The annular protruding portion may be directly formed on the lower surface of the ejecting member 27.

Figure 5:
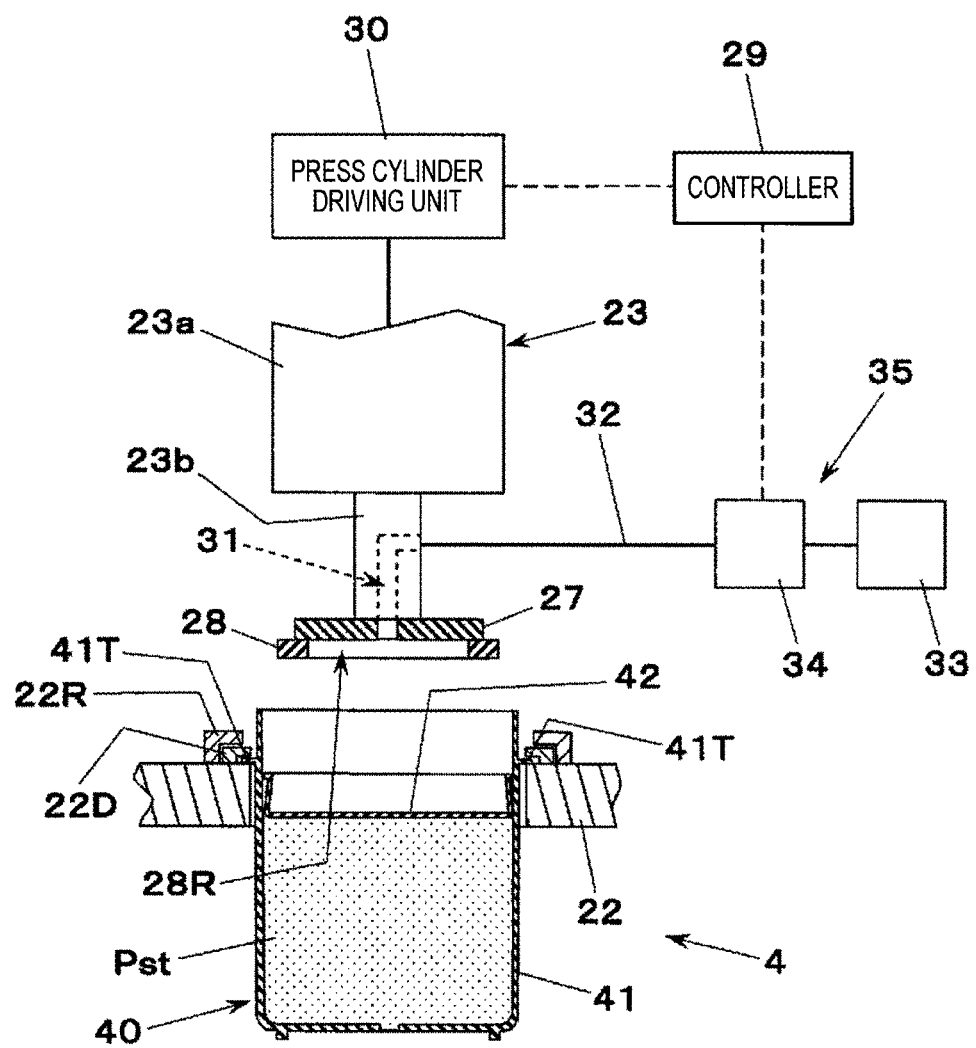
FIG. 5 is a diagram showing a control system of the paste supply apparatus according to the embodiment of the present invention.

As shown in FIG. 5, the screen printing machine 1 includes a controller 29 which controls a pressing cylinder driving unit 30. The pressing cylinder 23 is driven by the pressing cylinder driving unit 30 to pull and push the piston rod 23b, whereby the ejecting member 27 moves up and down. In other words, the pressing cylinder 23 serves as an example of an ejecting member lifting unit which moves up and down the ejecting member 27.

As shown in FIG. 5, in an inside of the ejecting member 27 and the piston rod 23b, a suction path 31 is formed. The suction path 31 connects an internal space (hereinafter referred to as an internal space 28R) surrounded by the annular member 28 provided in the ejecting member 27 (FIG. 4) with a negative pressure generator 33 via a pipe 32 extending in an outside of the piston rod 23b, and a valve 34 is interposed into the pipe 32. When the valve 34 is operated by the controller 29 in a state in which the negative pressure generator 33 generates negative pressure, vacuum pressure is supplied to the internal space 28R (i.e., the lower surface of the ejecting member 27) via the pipe 32 and the suction path 31, and suction power is generated in the internal space 28R. In other words, the suction path 31, the pipe 32, the negative pressure generator 33, and the valve 34 form a suction power generating mechanism 35 which generates the suction power in the internal space 28R of the annular member 28.

Figure 6A:
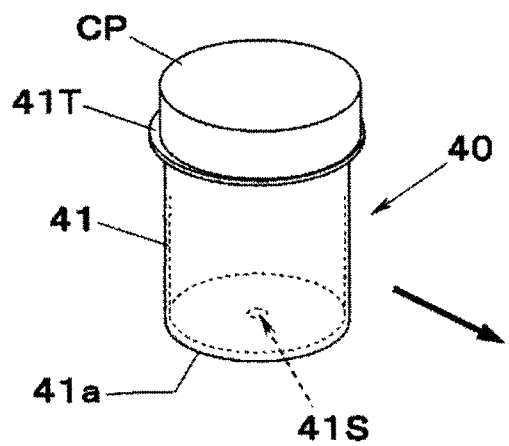
FIGS. 6A to 6C are partial cross-sectional views of a paste pot used for the paste supply apparatus according to the embodiment of the present invention.
Figure 6B:
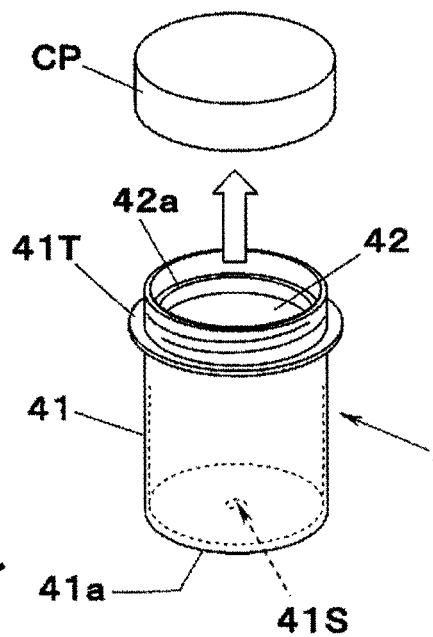
Figure 6C:
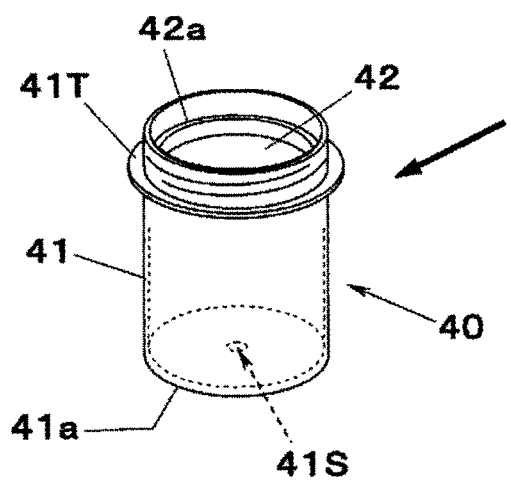

As shown in FIG. 6A to 6C, the paste pot 40 includes: the tubular container 41 which stores the paste Pst; and an inner lid 42 provided in the container 41, and a bottom portion 41a of the container 41 has a through hole 41S formed therein. An outer edge of the inner lid 42 is bent upward to form a bent portion 42a, and the bent portion 42a firmly contacts an inner wall of the container 41. The inner lid 42 is movable in the container 41 in the up-down direction. The paste pot 40 is placed to the pot holder 22 by removing a cap CP attached to an open end of the container 41 (from FIG. 6A to FIG. 6B), and thereafter setting a posture of the paste pot 40 such that the the the through hole 41S faces downward (FIG. 6C), and inserting the paste pot into the pot insertion hole 22H such that a flange portion 41T provided on a side surface of the container 41 abuts on an edge portion the pot insertion hole 22H from above.

As shown in FIGS. 2 and 3, each of the pot insertion holes 22H are sandwiched between a pair fixture holding members 22R from outside in the X-axis direction. When a pot fixture 22D is inserted, from front, the pair of fixture holding members 22R attached at positions sandwiching each of the pot insertion holes 22H, the flange portion 41T of the paste pot 40 abutting on the edge portion of the pot insertion hole 22H is held by the pot fixture 22D from above, and the paste pot 40 is held by the pot holder 22 in a state in which the movement in the up-down direction is regulated.

The positions of the two paste pots 40 held by the two pot insertion holes 22H are switched by a position switching operation of the moving body 25a of the rod-less cylinder 25, such that one of the paste pots 40 is positioned immediately below the pressing cylinder 23 (i.e., positioned at a paste supply position), and the other thereof is positioned at a position different from (right or left of) the paste supply position (i.e., positioned at a standby position). As shown in FIGS. 2 and 3, in the left and right regions on a lower portion of the base member 21, a plate-shaped paste catch 21c is provided so as to receive the paste Pst dropping from the through hole 41S of the paste pot 40 positioned at the standby position.

Figures 7A, 7B, 7C:
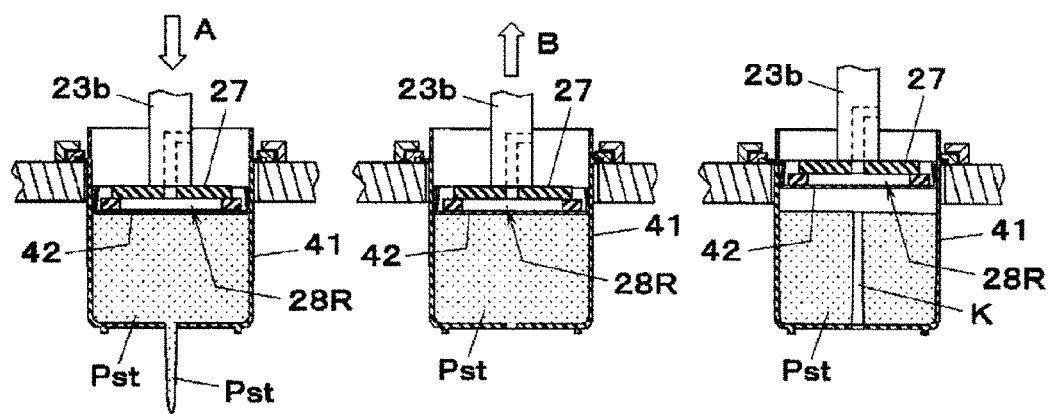
FIGS. 7A to 7C are operation diagrams of the paste supply apparatus according to the embodiment of the present invention.

Supply of the paste Pst of the paste supply apparatus 4 is performed by controlling the pressing cylinder 23 and the suction power generating mechanism 35 by the controller 29. When the controller 29 outputs a paste ejection command signal, the pressing cylinder 23 starts pushing operation of the piston rod 23b to move down the ejecting member 27. The pushing operation continues such that the lower surface of the annular member 28 of the lower surface of the ejecting member 27 abuts on an upper surface of the inner lid 42 of the paste pot 40 positioned at the paste supply position so as to further press down the inner lid 42 in the container 41 (FIG. 7A: an arrow A), thereby moving down the inner lid 42 in the container 41 and ejecting the paste Pst from the through hole 41S (FIG. 7A). In a state in which the ejecting member 27 abuts on the inner lid 42, the suction power generating mechanism 35 supplies the vacuum pressure in the internal space 28R (i.e., at the lower surface of the ejecting member 27) so as to generate the suction power, whereby the inner lid 42 is sucked and held by the ejecting member 27.

When a prescribed amount of the paste Pst is ejected by moving down the inner lid 42 by the pressing cylinder 23 by a predetermined length, the controller 29 stops outputting the paste ejection signal. Thereafter, the pressing cylinder 23 switches the operation of the piston rod 23b from the pushing operation to the pulling operation (FIG. 7B: an arrow B), and moves up the ejecting member 27 to lift the inner lid 42 by a predetermined length (FIG. 7B). By the lifting of the inner lid 42, the negative pressure is generated in the container 41, and the paste Pst in the vicinity of the through hole 41S is taken up into the container 41, whereby drop of the paste Pst from the through hole 41S is prevented. The lifting of the inner lid 42 preferably continues until, as shown in FIG. 7C, a tubular void portion K extending upward from the through hole 41S is formed by the sucked air from the through hole 41S.

When the paste is screen-printed on the board the paste, at first, the paste supply apparatus 4 supplies the paste Pst on the mask 2 as described above. During the supply of the paste Pst on the mask 2, the controller 29 controls the belt driving mechanism 24 to cause the paste supply apparatus 4 to reciprocate along the X-axis direction (i.e., the direction in which the squeegee 13 extends). Consequently, the paste Pst is supplied to spread on the mask 2 in the direction in which the squeegee 13 extends.

After completion of the supply of the Pst on the mask 2, the controller 29 controls a board moving mechanism (not shown) such that the board moving mechanism to cause the board to contact (or to be placed close to) the lower surface of the mask 2. When the board contacts (or is placed close to) the mask 2, the squeegee lifting mechanism 12 moves down one of the squeegees 13 such that the lower end of the squeegee 13 abuts on the mask 2. Thereafter, the head moving mechanism (not shown) described above moves the print head 3 along the Y-axis direction such that the squeegee 13 slides on the mask 2, and the electrodes of the board is filled with the paste Pst via the pattern holes of the mask 2. After completion of the filling of the paste Pst, the board moving mechanism moves the board to be separate from the mask 2. Consequently, the screen printing for one sheet of the board is finished.

The paste Pst can be supplied on the mask 2 by the paste supply apparatus 4 until the container 41 becomes empty of the paste Pst. When the inner lid 42 reaches a bottom of the container 41 and the empty of the paste Pst in the paste pot 40 is detected, e.g., by an output from a stroke sensor (not shown) of the piston rod 23b, the controller 29 controls the suction power generating mechanism 35 to release the holding (suction) of the inner lid 42 by the ejecting member 27, and then the pressing cylinder 23 performs the pulling operation to move up the ejecting member 27. Consequently, the ejecting member 27 is pulled upward out from the container 41, whereby the operator OP can detach the container 41 from the pot insertion hole 22H and exchange the paste pot 40 for a new one. Since the inner lid 42 of the used paste pot 40 remains in the container 41, the operator OP can dispose of the container 41 together with the inner lid 42.

As described above, according to the paste supply apparatus 4 and the screen printing machine 1 of the present embodiment, the ejecting member 27 presses down the inner lid 42 of the paste pot 40 held by the pot holder 22 to eject the paste Pst in the container 41 from the through hole 41S. Thereafter the ejecting member 27 lifts the ejecting member 27 sucking and holding the inner lid 42 to generate negative pressure in the container 41. Accordingly, the paste Pst in the vicinity of the through hole 41S is taken up into the container 41, and it is possible to prevent drop of the paste Pst from the paste pot 40. Consequently, waste of the paste Pst is reduced, and it is not necessary to clean off the paste Pst which drops, whereby productivity can be improved.

According to one or more embodiments of the present invention, it is possible to provide a paste supply apparatus and a screen printing machine which can prevent drop of paste from a paste pot.

What is claimed is:

1. A paste supply apparatus comprising:
   a pot holder which holds a paste pot comprising a tubular container which stores paste and which comprises a bottom portion having a through hole and an inner lid movable in the container, such that the through hole of the paste pot faces downward;
   an ejecting member having a diameter smaller than an inner diameter of the container;
   an annular protruding portion provided to protrude downward from a lower surface of the ejecting member, wherein the annular protruding portion is in direct contact with the inner lid of the paste pot, and an inner space entirely surrounded by the lower surface of the ejecting member, the annular protruding portion, and an upper surface of the inner lid is tightly sealed when a suction power is generated;
   a suction power generating mechanism which generates the suction power in an internal space surrounded by the annular protruding portion; and
   an ejecting member lifting unit which moves up and down the ejecting member, and which causes the ejecting member to press down the inner lid of the paste pot held by the pot holder to eject the paste from the through hole, and thereafter lifts the ejecting member which holds the inner lid by the suction power generated within the internal space of the annular protruding portion by the suction power generating mechanism.

2. The paste supply apparatus according to claim 1, wherein the ejecting member has a suction path connected to an opening formed in the lower surface of the ejecting member,
   wherein the annular protruding portion surrounds the opening, and
   wherein the suction power generating mechanism generates suction power in the internal space surrounded by the annular protruding portion via the suction path.

3. The paste supply apparatus according to claim 1, wherein when the ejecting member lifting unit moves up the ejecting member in a state in which the suction power generating mechanism releases generation of the suction power in the internal space, the ejecting member is separated from the inner lid.

4. A screen printing machine comprising:
   a mask;
   a paste supply apparatus which supplies paste on the mask by using a paste pot comprising a tubular container which stores the paste and which comprises a bottom portion having a through hole and an inner lid movable in the container;
   a squeegee slidable on the mask on which the paste is supplied by the paste supply apparatus,
   wherein the paste supply apparatus comprises:
   a pot holder which holds the paste pot such that the though hole faces downward;
   an ejecting member having a diameter smaller than an inner diameter of the container;
   an annular protruding portion provided to protrude downward from a lower surface of the ejecting member, wherein the annular protruding portion is in direct contact with the inner lid of the paste pot, and an inner space entirely surrounded by the lower surface of the ejecting member, the annular protruding portion, and an upper surface of the inner lid is tightly sealed when a suction power is generated;

a suction power generating mechanism which generates the suction power in an internal space surrounded by the annular protruding portion; and an ejecting member lifting unit which moves up and down the ejecting member, and which causes the ejecting member to press down the inner lid of the paste pot held by the pot holder to eject the paste from the through hole, and thereafter lifts the ejecting member which holds the inner lid by the suction power generated within the internal space of the annular protruding portion by the suction power generating mechanism.

5. The screen printing machine according to claim 4, wherein the ejecting member has a suction path connected to an opening formed in the lower surface of the ejecting member, wherein the annular protruding portion surrounds the opening, and wherein the suction power generating mechanism generates suction power in the internal space surrounded by the annular protruding portion via the suction path.

6. The screen printing machine according to claim 4, wherein when the ejecting member lifting unit moves up the ejecting member in a state in which the suction power generating mechanism releases generation of the suction power in the internal space, the ejecting member is separated from the inner lid.

\* \* \* \* \*